US006956406B2

(12) United States Patent
Seningen et al.

(10) Patent No.: US 6,956,406 B2
(45) Date of Patent: Oct. 18, 2005

(54) STATIC STORAGE ELEMENT FOR DYNAMIC LOGIC

(75) Inventors: Michael R. Seningen, Austin, TX (US); Terence M. Potter, Austin, TX (US); James S. Blomgren, Austin, TX (US)

(73) Assignee: Intrinsity, Inc., Austin, TX (US)

(*) Notice: Subject to any disclaimer, the term of this patent is extended or adjusted under 35 U.S.C. 154(b) by 497 days.

(21) Appl. No.: 10/187,879

(22) Filed: Jul. 2, 2002

(65) Prior Publication Data

US 2003/0110404 A1 Jun. 12, 2003

Related U.S. Application Data

(60) Provisional application No. 60/302,590, filed on Jul. 2, 2001, and provisional application No. 60/302,587, filed on Jul. 2, 2001.

(51) Int. Cl.[7] .............................................. H03K 19/20
(52) U.S. Cl. ......................................... 326/121; 326/93
(58) Field of Search ............................. 326/93–98, 112, 326/119, 121

(56) References Cited

U.S. PATENT DOCUMENTS

| 5,543,731 | A | * | 8/1996 | Sigal et al. ................... 326/40 |
| 5,576,651 | A |   | 11/1996 | Phillips ........................ 327/202 |
| 5,841,712 | A |   | 11/1998 | Wendell et al. .............. 365/200 |
| 5,917,355 | A | * | 6/1999 | Klass ........................... 327/208 |
| 5,920,218 | A |   | 7/1999 | Klass et al. .................. 327/200 |
| 6,043,696 | A |   | 3/2000 | Klass et al. .................. 327/211 |
| 6,066,965 | A |   | 5/2000 | Blomgren et al. ........... 326/95 |
| 6,069,497 | A |   | 5/2000 | Blomgren et al. .......... 326/105 |
| 6,118,304 | A |   | 9/2000 | Potter et al. ................. 326/93 |
| 6,121,807 | A |   | 9/2000 | Klass et al. .................. 327/218 |
| 6,201,415 | B1 | * | 3/2001 | Manglore ..................... 326/98 |
| 6,202,194 | B1 |   | 3/2001 | Seningen et al. ............ 716/10 |
| 6,219,686 | B1 |   | 4/2001 | Petro et al. .................. 708/670 |
| 6,246,266 | B1 | * | 6/2001 | Bosshart ....................... 326/98 |
| 6,269,387 | B1 |   | 7/2001 | Petro et al. .................. 708/710 |
| 6,289,497 | B1 |   | 9/2001 | Leight et al. ................. 716/17 |
| 6,324,239 | B1 |   | 11/2001 | Potter et al. .................. 377/64 |
| 6,367,065 | B1 |   | 4/2002 | Leight et al. ................. 716/18 |
| 6,437,602 | B1 | * | 8/2002 | Friend et al. ................. 326/93 |
| 6,469,953 | B1 | * | 10/2002 | Hong ...................... 365/230.08 |
| 6,529,045 | B2 | * | 3/2003 | Ye et al. ....................... 326/95 |

OTHER PUBLICATIONS

Kukimoto, Yuji and Jang, Jae-Young, "VIS CTL Syntax" Manual dated Feb. 27, 1997, The VIS Group, Univ. of CA.

* cited by examiner

Primary Examiner—Don Le
(74) Attorney, Agent, or Firm—Mathew J. Booth & Associates, PLLC

(57) ABSTRACT

A storage element (100, 200) is capable of statically storing a dynamic input signal, and providing that static signal to dynamic logic gates. The element receives at least two input logic signals (150, 170), one of which is a dynamic signal (150) that may be one wire of a 1-of-N signal used in FAST14 logic from a dynamic logic gate (72) that may be a NDL gate, and generates one or more static logic output signals (190, 192). The element, which may or may not receive a clock signal (160), holds its outputs until its dynamic input (150) switches value on a subsequent evaluate cycle and at least one other input, which may be a write enable signal (170), changes signal value. In an alternative embodiment (200), the element may not change output values until a reset signal (330) is received during a prior clock cycle.

18 Claims, 3 Drawing Sheets

STATIC STORAGE ELEMENT FOR DYNAMIC LOGIC

CROSS REFERENCE TO RELATED APPLICATIONS

This application claims the benefits of the earlier filed U.S. Provisional Application Ser. No. 60/302,587, filed 2, Jul. 2001 (2 Jul. 2001), which is incorporated by reference for all purposes into this specification.

Additionally, this application claims the benefits of the earlier filed U.S. Provisional Application Ser. No. 60/302,590, filed 2, Jul. 2001 (2 Jul. 2001), which is incorporated by reference for all purposes into this specification.

BACKGROUND OF THE INVENTION

1. Field of the Invention

The present invention relates to area and power management in dynamic logic. More specifically, the present invention relates to statically storing the value of dynamic signals under certain operating conditions and in selected areas of dynamic logic to reduce the overall power consumption of the design without affecting performance.

2. Description of the Related Art

High performance complementary metal-oxide semiconductor (CMOS) very large scale integrated (VLSI) circuits are increasingly using dynamic logic gates to improve circuit performance. Dynamic logic gates are fast, but require a frequent refresh to hold a logic state. Constantly switching transistors on and off to precharge and then evaluate dynamic logic gates consumes an enormous amount of power. Accordingly, because of the power and noise constraints on dynamic logic gates, many high performance CMOS VLSI are designed using conventional static logic gates outside the critical path of the logic. Static circuits hold state without a frequent refresh. Since power is consumed only when the inputs switch, static circuits consume much less power than dynamic circuits.

However, static circuits are generally slower than dynamic circuits, and mixing the two has been problematic. Static flip-flops have been used to interface dynamic logic and static logic, but this typically creates timing and performance problems due to the long setup and hold times associated with static flip-flops. In addition, static signals (i.e., non-precharged) that feed dynamic circuits also have long setup times.

Conventional static flip-flops generally have uncertainty when the flip-flops' output signals become stable. Consequently, depending on the clock rate, the time required for a conventional static flip-flop's output signals to become stable may extend into the evaluation phase of the dynamic logic gate that the static flip-flop is driving. This delay while the flip-flop's output becomes stable is the setup time. In the past, designers have accommodated the setup delay by simply operating the design at a slower clock rate, thus giving the static flip-flop adequate time to provide stable output signals to the dynamic logic gate before the dynamic logic gate enters the evaluation period. Alternatively, some designers have inserted a clock delay between a static flip-flop and the dynamic gate the flip-flop is driving, to delay the gate's evaluation phase enough to insure that the flip-flop's outputs are stable. Neither solution is practical for today's high performance circuits. The timing constraints that typical static flip-flops impose on designers trying to use them in dynamic logic is described in detail in U.S. Pat. No. 6,118,304 (hereinafter, the "Logic Synchronization Patent"), which is incorporated by reference for all purposes into this specification.

The Logic Synchronization Patent and the documents referenced therein, specifically, U.S. Pat. No. 6,066,965, entitled "Method and Apparatus for a Logic Circuit using 1 of 4 Signals" (hereinafter, "the NDL patent") also describe the use of NDL or N-NARY dynamic logic and a novel multiphase clock scheme for logic timing and synchronization that makes extensive use of 'time-borrowing' to achieve the extremely fast logic required for current high-performance applications. NDL, which is part of FAST14logic technology, is a new logic family developed by Intrinsity Inc. (f/k/a EVSX Inc.), the Assignee of this application. Although, as the NDL patent details, the FAST14 logic technology includes features that cause circuits implemented in FAST14 logic (denoted as "NDL gates" or "NDL designs") to consume much less power than traditional dual-rail dynamic logic, even highly complex NDL designs can suffer some of the power problems associated with the high switch factor of traditional dynamic logic. Consequently, designers of NDL logic circuits and systems may find it advantageous to incorporate static storage elements into their designs. For example, designers may want to use a static storage element that receives one or more 1-of-N signals from a source NDL gate and stores those signal values for multiple clock phases, until they are required to feed a destination NDL gate, rather than passing the signals through a series of dynamic buffers between the source and destination gates. Similarly, designers may want to insert static storage elements into logic areas that are dormant for specific periods of time, thus eliminating the power required to evaluate logic gates that are not in active use.

FAST14 logic elements, features, and principles that are relevant to the present invention are further described in U.S. Pat. No. 6,219,686 (Sum/HPG Adder/Subtractor Gate), U.S. Pat. No. 6,202,194 (Twizzle), U.S. Pat. No. 6,324,239 (Shifter), U.S. Pat. No. 6,269,387 (3-Stage 32-Bit Adder), and U.S. Pat. Nos. 6,367,065 and 6,259,497 (collectively, Hardware Development Language and Tools), all of which are incorporated by reference for all purposes into this specification. In addition, the present invention is related to U.S. patent application Ser. No. 10/186,770, filed on 1, Jul. 2002 now U.S. Pat. No. 6,714,045, and entitled "Static Transmission of FAST14 Logic 1-of-N Signals", which is incorporated by reference for all purposes into this specification.

SUMMARY OF THE INVENTION

The present invention is a storage element apparatus and a method of making and using that apparatus. The static storage element is capable of statically storing a dynamic input signal, and providing that signal to dynamic logic gates, thereby reducing the power consumption of the overall design in areas that are not timing-critical. The static storage device receives at least two input logic signals wherein at least one is a dynamic signal from a dynamic logic gate. The static storage device, which may or may not receive a clock signal, generates one or more static logic output signals. The static storage device includes a storage circuit comprising not more than eighteen transistors that holds at least one of the device's outputs at the signal value of at least one of the device's dynamic inputs until that input switches value on a subsequent evaluate cycle and at least one other input logic signal, which may be a write enable signal, changes signal value. The dynamic input signal may comprise one wire of a FAST14 1-of-N logic signal from a NDL cell. In an alternative embodiment, the storage device may not change output values until a reset signal is received during a prior clock cycle.

DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention is a static storage element apparatus and method that enables designers to reduce power consumption without adversely impacting the performance of their dynamic logic designs by embedding static storage elements at strategic locations. Unlike traditional static circuits, the static storage element of the present invention does not impose significant signal setup and hold delays. This disclosure describes numerous specific details that include specific structures, circuits, and logic functions in order to provide a thorough understanding of the present invention. One skilled in the art will appreciate that one may practice the present invention without these specific details. Additionally, this disclosure does not describe the details of some well known structures such as transistors, FETs, domino circuits, traditional dynamic circuits, FAST14 logic, and NDL circuits in detail in order not to obscure the present invention. While this disclosure details the use of the present invention in NDL designs, those skilled in the art will understand that the present invention is capable of use in any dynamic logic design, and is not limited to the FAST14 logic technology unless such limitation is specifically disclosed. Finally, those skilled in the art will understand that the descriptors "N-NARY", "FAST14" and "NDL" are trademarks owned by Intrinsity Inc. (f/k/a EVSX Inc.) that describe and relate to a new dynamic logic family developed by Intrinsity, which is the Assignee of this application. "N-NARY logic" and "FAST14 logic" mean the same thing and are used interchangeably throughout this specification. "NDL circuits" and "NDL gates" are 1-of-N dynamic logic circuits implemented in the FAST14 logic technology. A "1-of-N signal" refers to the multi-wire 1-hot signal used in FAST14 technology that has the specific physical and functional characteristics further described in the NDL Patent and the other patents referenced above.

Figure 1:
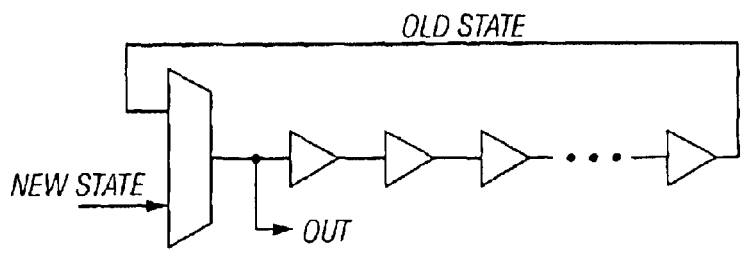
FIG. 1 shows the dynamic storage element (a buffer loop) typically used in dynamic logic that the present invention replaces.

The present invention provides designers with the capability of adding static logic to the generally dynamic logic design flow, enabling designers to address the problem of consuming excessive power for logic values that usually do not change from one cycle to the next. Designers can use the present invention in lieu of dynamic storage buffers without incurring large timing penalties, which as described above, could limit the operating frequency of a device. In general, the present invention adds support for 'multi-cycle' paths in the design flow. FIG. 1 shows the dynamic storage element (a buffer loop) typically used in dynamic logic that the present invention replaces.

Figure 2A:
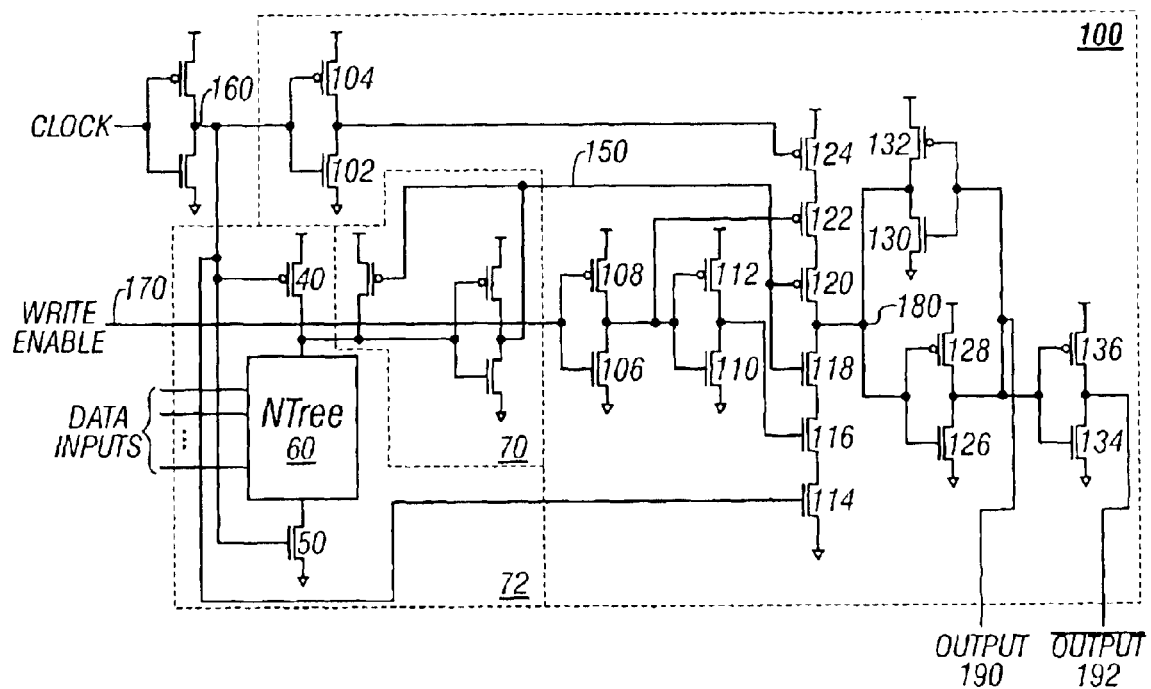
FIG. 2A shows an embodiment of the present invention embedded in a design implemented in FAST14 logic.
Figure 2B:
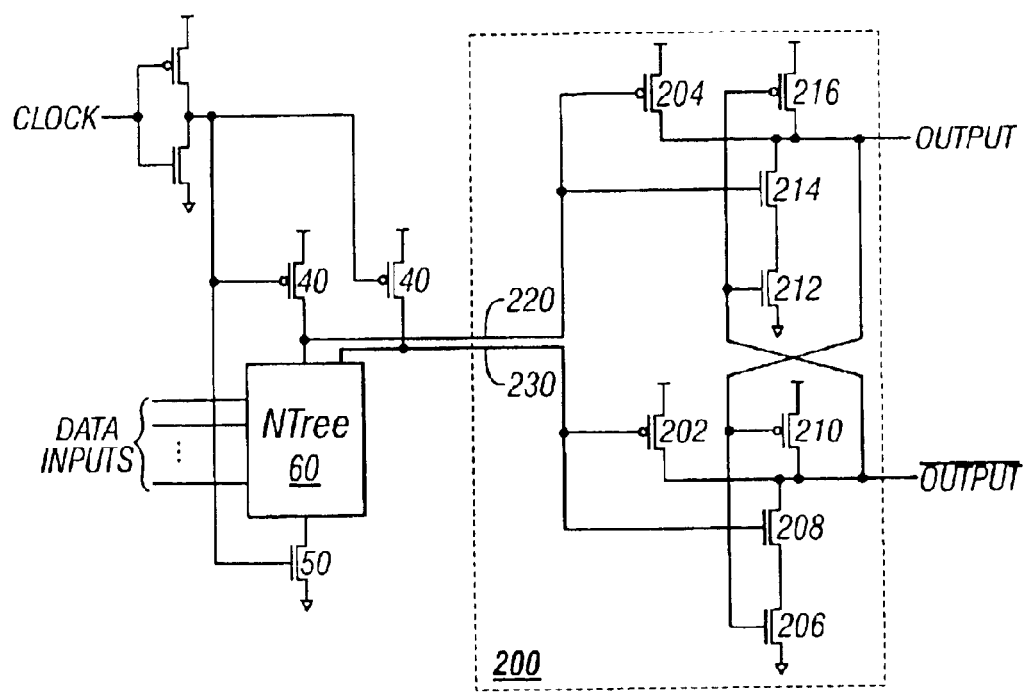
FIG. 2B shows an alternative embodiment of the present invention in a FAST14 logic design.
Figure 2C:
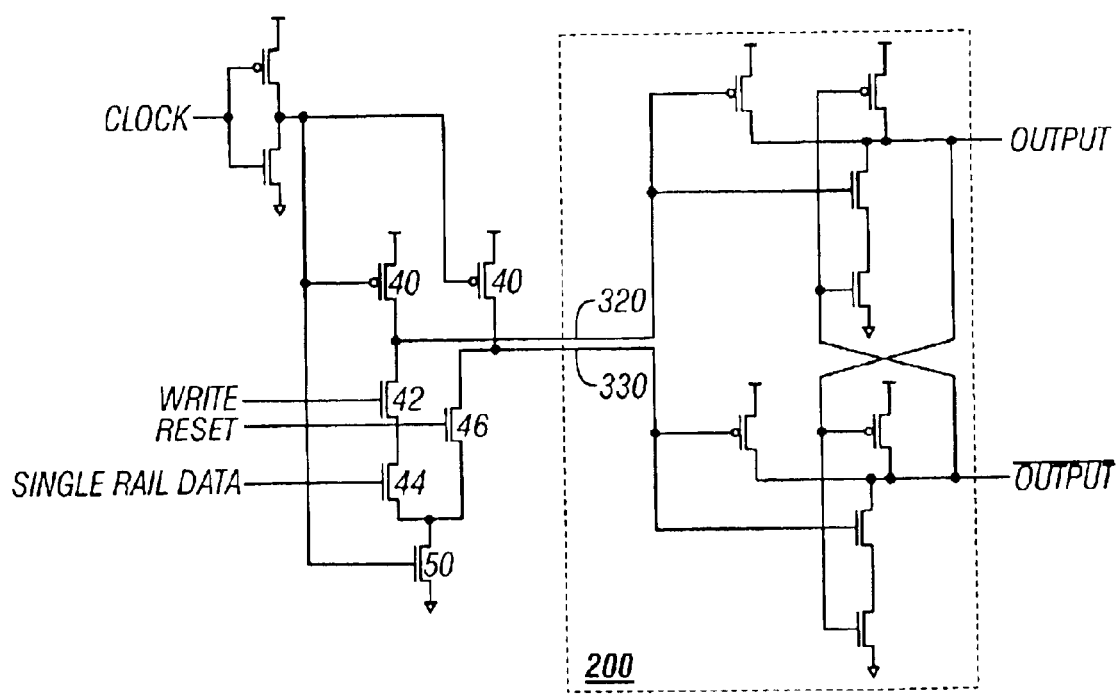
FIG. 2C shows the alternative embodiment of the present invention embedded in a typical single rail dynamic logic design.

FIGS. 2A, 2B, and 2C illustrate two embodiments of the present invention capable of being embedded into dynamic logic. FIG. 2A shows a static storage element 100 (referred to as an fblat) with an input signal 150 that comprises one wire of the 1-of-N output signal of a NDL cell 72 that includes a precharge device 40, evaluate device 50, logic tree 60, and half-keeper output driver 70. FIG. 2B shows a different embodiment of the present invention in a NDL design, wherein the output driver 70 typically included with NDL cells has been eliminated, and replaced by the present invention embodied as an SR-latch output driver 200. In FIG. 2B, the logic tree 60 evaluate nodes 220 and 230 comprise two inputs to the static storage element 200. Finally, FIG. 2C shows the same SR-latch embodiment 200 shown in FIG. 2B in the context of a typical dynamic circuit with a single rail data input and write/reset capability. Note that both embodiments of the static storage device 100, 200 produce complimentary outputs, but those skilled in the art will recognize that either of these devices could be modified to produce single-rail outputs, according to the designer's requirements.

Turning to FIG. 2A, inputs to the fblat storage device 100 include one wire of the NDL cell output 150, clock signal 160, and a write enable signal 170, which can be either a static or dynamic signal. Clock signal 160 gates transistor 114 and is inverted by transistors 102 and 104 to gate PFET 124. The logic cell output 150 gates PFET 120 and NFET 118. Write enable signal 170 is inverted by transistors 108 and 106 and inverted again by transistors 112 and 110; the write enable signal 170 gates NFET 116 and the inverted version of write enable 170 gates PFET 122. Consequently, node 180 is high when the clock signal 160 is high, the write enable signal 170 is high, and the output 150 of the NDL cell is low. In this state, transistors 126 and 128 drive Output 190 low and transistors 134 and 136 provide its complement 192. Node 180 is low when transistors 114, 116, and 118 conduct; this occurs when the clock signal 160 is high, the write enable signal 170 is high, and the output 150 of the NDL gate is high. When node 180 is low, Output 190 is high and its compliment 192 is low.

Transistors 130 and 132 insure that once latched, node 180 is capable of holding its state indefinitely, even if signal 150 changes state during subsequent clock cycles. The fblat will not refresh its outputs until the write signal 170 is enabled, the FAST14 logic tree evaluates, and the clock signal 160 is high. This allows designers to capture and store the state of the logic cell output 150 for as many clock cycles as the design requires, eliminating the need for a series of dynamic storage buffers that must refresh and thus consume unnecessary power every clock cycle.

The fblat logic can be replicated to capture and store the state of each output wire of a 1-of-N output signal of a typical NDL cell. Additionally, those skilled in the art and familiar with the FAST14 logic design style will understand that, depending upon the functionality of the circuit under design, combinatorial logic can be added to the output wires of the NDL cell to reduce the number of fblats require to fully capture and store the NDL cell output.

FIG. 2B shows an alternative embodiment of a static storage device interfacing with FAST14 logic. In FIG. 2B, the storage device 200 is shown in the context of a NDL gate 60 having a 1-of-2 FAST14 output signal comprising output wires 220 and 230.

When the logic tree 60 is in precharge, precharge transistors 40 conduct and nodes 220 and 230 are high. When the logic tree 60 evaluates, evaluate transistor 50 conducts and one of the nodes 220 or 230 (only one) will discharge through the logic tree 60. Those familiar with the FAST14 logic family will recall that a fundamental feature of FAST14 logic is that the 1-of-N signal used in FAST14 logic is 1-hot; i.e., the signal value of the 1-of-N signal is determined by which one of the multiple output wires of the 1-of-N signal is high. When the logic gate is in precharge and nodes 220 and 230 are high, transistors 214 and 208 conduct and transistors 204 and 202 are turned off. When the gate evaluates, if node 230 discharges, then transistor 202 conducts and transistor 208 is turned off. This drives Output bar high, turns on transistor 212, and keeps transistor 216 turned off. Node 220 did not discharge, but is still high from being precharged, so transistor 214 is conducting and transistor 204 is off. Since transistors 214 and 212 are conducting, and 204 and 216 are off, Output is driven low and transistor 210 conducts. This keeps Output bar high, which in turn keeps Output low. When the gate next precharges, transistor 202 will turn off and transistor 208 will conduct, but Output bar will continue to stay high because transistor 206 is not conducting. As long as Output bar stays high, Output will stay low because transistor 212 will stay turned on. Consequently, transistors 206, 208, 210, 212, 214, and 216 comprise a feedback circuit that holds the state of Output and Output bar even when nodes 220 and 230 go high at precharge. When the gate evaluates and either node 220 or 230 discharges, either transistor 202 or transistor 204 will begin to conduct, forcing either Output or Output bar high, which then drives the appropriate set of feedback transistors to force the compliment to the opposite state. In other words, the outputs of the storage device 200 will only change if one of the inputs 220 or 230 transitions from high-to-low. Low-to-high transitions will not affect the storage device's outputs.

In this embodiment, Output and Output bar will refresh every time the logic tree 60 evaluates. However, those skilled in the art will recall that FAST14 logic utilizes a multiphase clock for timing and logic synchronization as described in the Logic Synchronization patent, and in the typical data flow, outputs from a phase 0 gate comprise inputs to a phase 1 gate, which feeds a phase 2 gate, and so on. Logic designers may find the storage device 200 shown in FIG. 2B useful to replace dynamic buffers in cases where the output of a phase 0 gate feeds a gate that receives a "later" clock phase than a phase 2 clock. Moreover, designers may find the static storage device 200 shown in FIG. 2B particularly useful because it does not require a high speed clock signal. Finally, Output and Output bar are glitchless—that is, they never inadvertently switch to the wrong logic state during transition periods.

FIG. 2C shows the same static storage device 200 shown and described in connection with FIG. 2B in the context of a traditional single rail dynamic logic design. The outputs are set by first asserting the reset signal 332, which turns on transistor 46 and discharges node 330. This is a high-to-low transition that will set Output bar high, and Output low, as described above. The storage device 200 holds these values when transistors 40 precharge, and if write 340 is asserted when the gate evaluates, the outputs of the storage device 200 will switch if the single rail data input 334 is high. If the single rail data input 334 is low, node 320 will not discharge and the outputs will not switch, because Output will already be correctly set low, appropriately reflecting the value of the single rail data input 334. In each case, in order to write new data, the gate must be reset in the previous cycle (since the single rail data can only set the latch). In many applications this is not difficult (e.g. a register file). Opposite logic functions can be had by swapping 340 and 332.

FIGS. 3–6 show several uses of static storage in FAST14 logic blocks. These figures address several common topologies within typical processor designs, both in control and data-flow logic. After reading this specification and/or practicing the present invention, those skilled in the art will recognize many other applications where the present invention can be used to reduce overall power consumption or area without sacrificing performance or introducing logic timing or synchronization problems.

Figure 3:
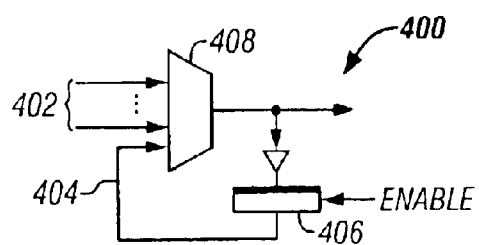
FIG. 3 illustrates a dynamic MUX that selects between multiple dynamic inputs and a static input stored using the present invention, wherein the MUX output is optionally stored by the present invention.

FIG. 3 illustrates a circuit 400 that receives multiple inputs 402 that may comprise one or more 1-of-N signals, selects between them and a stored value 404 that is the output of the static storage device 406, and optionally captures the result into the static storage device 406. In this case, the savings is more in terms of area than power since the static storage device 406 is only replacing some small buffer devices, and the dynamic MUX 408 still precharges and discharges every cycle, even if selecting the static data value 404. Nevertheless, there is a measurable power savings. Those skilled in the art will recognize that this arrangement of dynamic mux/static storage would be highly useful in a state machine or in a processor pipeline architecture capable of stalling.

Figure 4:
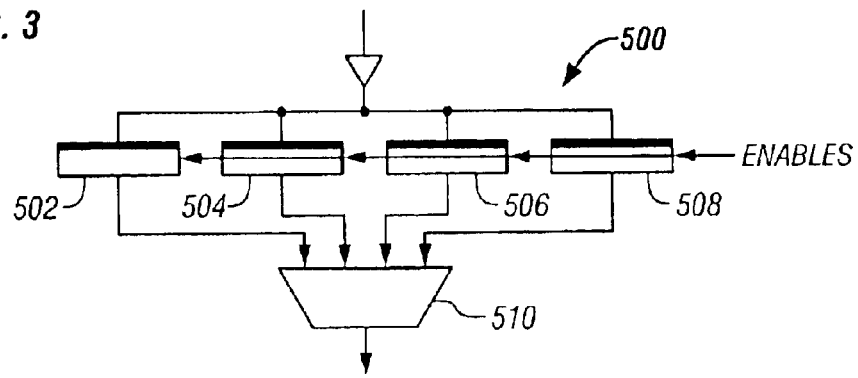
FIG. 4 shows a dynamic MUX that selects from a circular queue of static inputs.

FIG. 4 shows a set of storage devices 502, 504, 506, and 508 whose outputs are sent to a dynamic mux 510. Here, both power and area are conserved because the static storage devices 502, 504, 506, and 508 replace a large number of dynamic buffers. The dynamic mux 510 allows the data to be accessed very quickly. This arrangement addresses a common issue with static data—quite often the critical path is in selecting the correct data (i.e. the mux select), not in producing it. Those skilled in the art will recognize that this storage/mux arrangement would be highly useful in creating circular queues or register file structures.

Figure 5:
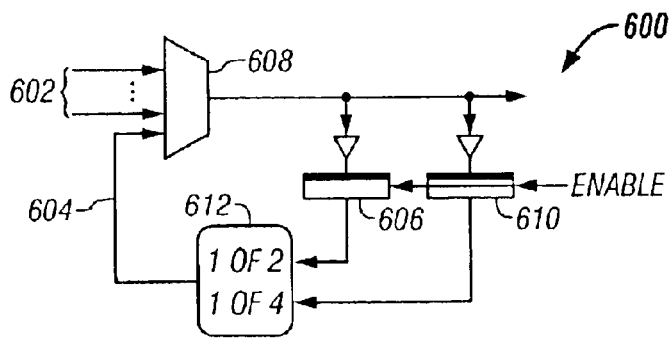
FIG. 5 shows the present invention interfacing with a static decoder and a dynamic MUX in a dynamic logic design.

FIG. 5 illustrates a logic circuit similar to that shown in FIG. 3, but in this case, a different FAST14 encoding is desired for the static data entering the mux 608. Again, the dynamic mux 608 selects between incoming dynamic data 602 and static data 604. This time, there is a static decoder 612 on the output of static storage elements 606, 610, which provides the correctly formatted static data to the mux 608, using a minimal amount of power (the static decoder only burns power when the data changes value). This would be, again, a common structure usable in any pipeline that can stall that uses a FAST14 data encoding scheme other than 1-of-2.

Figure 6:
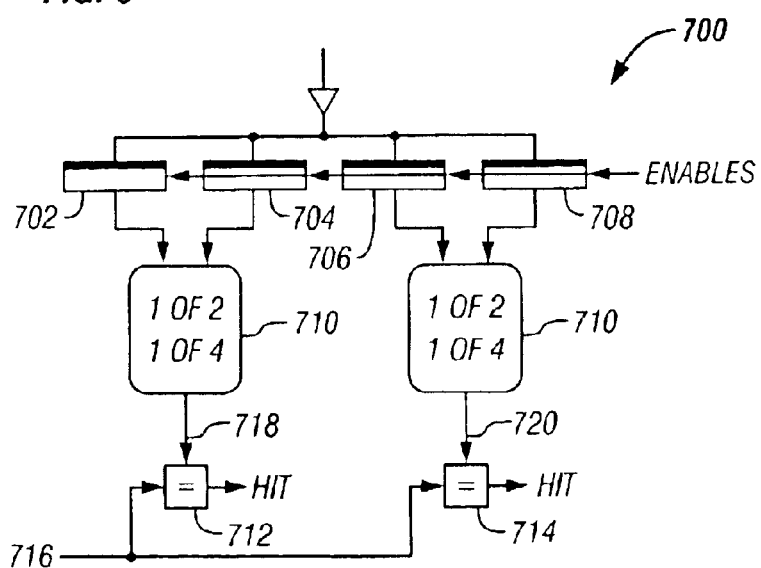
FIG. 6 shows the use of the present invention to build a circular queue of static inputs that are statically decoded for a dynamic comparator circuit.

FIG. 6 shows a comparator structure 700 that compares two statically stored data elements 718, 720 against a single data element 716 that arrives as a dynamic signal. Static storage devices 702, 704, 706, and 708 store data 718 and 720 that might be encoded in either a 1-of-2 FAST14 signal or a 1-of-4 FAST14 signal. Decoders 710 decode the statically stored data and provide it to dynamic comparators 712, 714. This structure is common in dependency checking logic, TLB structures, branch target address caches, and any number of memory coherency structures. Those skilled in the art will appreciate that when performing these types of functions, most of the required data may be known for a relatively long period of time, and the comparison needs to be performed very quickly after the last remaining required data, which is timing-critical, arrives.

As discussed above, static signals that feed dynamic gates must be stable by the time the dynamic gate goes into its evaluate state for every cycle. Once an N-tree has been discharged, it cannot be pulled high again until the next pre-charge phase. This means that a static input signal must be monotonic—it cannot transition from high-to-low during the evaluate phase of the gate if the static input signal's high value has been allowed to start switching the gate. Designers have thus typically imposed long setup time requirements on static signals that are inputs to dynamic logic to insure that a static input signal has arrived and is stable and not oscillating before the gate evaluates. One of the benefits of the present invention is that it allows designers to rely on functional behavior to relax the typical timing requirements on signals from the static storage devices of the present invention as they feed downstream dynamic gates. In general, static storage devices are placed in the design such that the static signal from a static storage device is prevented from discharging the N-tree in its dynamic receiving gate while the static signal is unstable (in the process of switching). This allows an arbitrary latency through the static logic, and allows the NDL receiving gate to be of any phase, both features are very valuable in making the static logic usable in high-speed design. The designer can decide on the desired delay through the static logic, and use this to drive the physical build and analysis tools (e.g. static timing analysis, gate sizing, etc.), as well as the functional simulation model, in the form of assertions which are suitable for either formal verification techniques or cycle-by-cycle checking in cycle or event-driven simulation.

The following discussion provides an example that illustrates how designers can implement the static storage devices of the present invention in their FAST14 designs, using the hardware development language and tools disclosed in U.S. Pat. Nos. 6,367,065 and 6,289,497, both of which are assigned to the assignee of the present invention, Intrinsity, Inc. (formerly, EVSX, Inc.). In addition, the following discussion assumes that those skilled in the art are familiar with the commonly used transistor-level static timing analysis tool PATHMILL (available from Synopsis, Inc.) and the simulation tool VIS (Verification Interacting with Synthesis), fully documented and available for download at the VIS homepage (http://vlsi.colorado.edu/~vis/index.html).

A static timing analysis such as that conducted by PATH-MILL performs setup and hold checks (among others) relative to clock edges on signals arriving at timing points. The evaluation of a signal is initiated at another point in the design, by some clock edge. Normally, designers check that a signal meets the setup and hold time requirements relative to every instance of a clock edge. An "instance" of a clock edge refers to a specific case of a clock edge—if the rising edge of clk0 is a clock edge, then each time clk0 rises is an instance of that edge. For example, assume that a signal N is generated by a gate A driven by a phase 0 clock signal clk0, and received by a gate B driven by a phase 1 clock signal clk1. Normally we would check to insure that if clk0 rises, signal N makes it to gate B in time to make its setup time relative to the immediately following falling edge of clk1. More specifically, we might verify that N arrives at gate B at least 100 ps before the fall of clk1, and is held there until at least 100 ps after the fall of clk1.

However, suppose signal N is not a critical path signal in the design. Suppose it is not critical for gate B to evaluate and generate a signal during the phase 1 clock instance that immediately follows the specific phase 0 clock instance that causes gate A to generate signal N. In this case, one or more cycles of the phase 1 clock can be "skipped" before we require an output from gate B. Therefore, signal N is on a "multicycle" path and setup and hold checks need not be performed for some clock edge instances. Continuing with the above example, if we have to wait longer for N to propagate or if we simply don't care if N arrives at gate B before the immediately following phase 1 clock instance, we might choose to perform the setup and hold time checks relative to the second falling edge of clk1 after the rise of clk0 (skipping one falling edge of clk1).

Consider a phase 2 fblat as shown in FIG. 2A feeding a phase 2 dynamic read gate. The gate instantiation is as follows:

```
{
net
 p5l_rs_B0_1h2;
 p5l_rs_B0_1h2 = p5l_rs_B0_1h1;
 inst fblat1 (
  "p6_rs_B0",
  "clk", phase2,
  "i", p5l_rs_B0_1h2,
  "o", p6_rs_B0_1S2,
  "ena", p6l_ps_wr_en_1h1
 );
}
p5l_rs_B0_1h2 =
 (1 * (((p5l_rs_B0_1h1 = = 1)  && (p6_rs_ps_sel_3h1 = = PS_P5)) ||
    ((p6l_rs_ps_fwd_B0_1h1 = = 1) && (p6_rs_ps_sel_3h1 = = PS_FWD)) ||
    ((p6_rs_B0_1S2 = = 1)  && (p6_rs_ps_sel_3h1 = = PS_P6))));
```

Normally, we would perform a setup check on p6_rs_B0_1S2—the output of the fblat—to insure that it meets a set-up to the rising edge (since it is a static signal) of the phase 2 clock (clk2), and also that it meets a hold-time relative to the falling edge (again, since it is static) of clk2. This verifies that the output of the fblat becomes and remains stable while the dynamic read gate evaluates. Functionally, this setup and hold check on the fblat output ensures that the signal does not change while we are reading it (i.e., we are ensuring that we never read and write the fblat at the same time). Thus, we do not want to check the setup time to the same edge as is triggering the signal propagation (recall that the fblat is receiving a phase 2 clock), because we are writing to the fblat during that phase 2 clock instance. We want to skip to the next rising edge of the phase 2 clock to check the setup time, because it is that instance of the phase 2 clock during which the next dynamic gate will read the fblat. Similarly, we need to check that the fblat output signal holds its state only to the falling edge of that "read instance" of the phase 2 clock, because it is the falling edge of that instance of the phase 2 clock that triggers the next precharge phase of the read gate.

Obviously, if designers disable checks in PATHMILL based on the designer's belief that the behavior is functionally guaranteed, the desired functional behavior should be verified in functional simulation. In order to do that, we want to create a generic set of assertions that can be used during functional simulation to check that illegal behavior does not occur. Ideally, we want to create a single set of assertions that can be automatically split into different statement sets as appropriate for the different verification tools used during the development. Practitioners of the present invention accomplish this by creating a pragma that the compiler(s) used by the practioners' tools will interpret to create statement sets appropriate for each tool. Those skilled in the art understand that a pragma is ordinarily a standardized form of comment that has meaning to a compiler. It may use a special syntax or a specific form within the normal comment syntax. In its ordinary use, a pragma will convey nonessential information that is often intended to help the compiler to optimize the program. As used by the present invention, however, the pragma conveys essential multi-cycle path information that each tool compiler interprets to create assertions that test the functionality or timing requirements specified by the pragma.

The assertions appropriate for simulation need to capture the circuit's behavior around the specific clock edges we identified as inappropriate for setup and hold checks in PATHMILL. In other words, we want to ensure that illegal behavior does not occur around these specifically identified clock edges. Continuing with the above example, we want to ensure that we will never read and write the fblat at the same time.

The fblat counts as being written whenever the following statement (write statement) is true:

$$(p6l\_ps\_wr\_en\_1h1==1)$$

The fblat counts as being read whenever the following statement (read statement) is true:

$$(p6\_rs\_ps\_sel\_3h1==PS\_P6)$$

This is designer specified, however, it can be automatically checked. If we vary the values of the input signals any time the read statement is false, the value of the signal resulting from the multi-cycle path (in this example, $p6\_rs\_B0\_1S2$) should not affect the output of the gate.

Finally, there is the timing aspect—the fact that we are saying we will not read and write simultaneously. This relates to the clock edges we determined that we did not care about, as described above in connection with the PATHMILL discussion.

So, one could use the following syntax for a pragma that specifies a multi-cycle path (in the source code):

```
#pragma multi-cycle p5l_rs_B0_1h2 <read (p6_rs_ps_sel_3h1 == PS_P6)>\
        <input p6_rs_B0_1S2>    \
    <forward 1>                 \
    <backward 1>
```

In simulation, this creates the following asserts (written in CTL syntax for a VIS functional simulation tool)

```
#pragma assert AG((p6l_ps_wr_en_1h1 == 1) -> !(p6_rs_ps_sel_3h1 == PS_P6)) \
    "failed setup timing assertion for gate p5l_rs_B0_1h2"
#pragma assert AG((p6_rs_ps_sel_3h1 == PS_P6) -> !(p6l_ps_wr_en_1h1 == 1)) \
    "failed hold timing assertion for gate p5l_rs_B0_1h2"
```

In PATHMILL we get the following statements from the pragma:

multi_cycle_path p6_rs_B0_1S2 p5l_rs_B0_1h2.bla mode= max dir=forward 2 multi_cycle_path p6_rs_B0_1S2 p5l_rs_B0_1h2.bla mode= min dir=backward 2

(p5l_rs_B0_1h2.bla is the node-name of the input pin of p51_rs_B0_1h2 which is driven by p6_rs_B0_1S2 ).

As a trickier example we might have something like:

```
{
net
 p5l_rs_B[1:0]_1h2;
 p5l_rs_B[1:0]_1h2 = p5l_rs_B[1:0]_1h1;
 inst fblat2 (
 "p6_rs_B[1:0]",
 "clk", phase2,
```

```
        -continued
"i", p5l__rs__B[1:0]__1h2,
"o", p6__rs__B[1:0]__2S2,
"ena", p6l__ps__wr__en__1h1
);
}
// A static 1-of-2 to 1-of-4 converter
inst r2__to__r4 (
"p6__rs__B1__0",
"i", p6__rs__B[1:0]__2S2,
"o", p6__rs__B1__0__4S2
);
p5l__rs__B1__0__4h0 =
  ((p5l__rs__B1__0__4h3      * (p6__rs__ps__sel__3h3 == PS__P5)) ||
    (p6l__rs__ps__fwd__B1__0__4h3 * (p6__rs__ps__sel__3h3 == PS__FWD)) ||
    (p6__rs__B1__0__4S2  * (p6__rs__ps__sel__3h3 == PS__P6  )));
```

Here, we have a phase 0 gate looking at a phase 2 static signal. The designer might specify the following timing constraint:

```
#pragma multi-cycle p5l__rs__B1__0__4h0 <read (p6__rs__ps__sel__3h3 == PS__P6)> \
       <input p6__rs__B1__0__4S2>        \
       <forward 1>                       \
       <backward 1>
```

The resulting PATHMILL assertions are basically the same:

```
   multi__cycle__path p6__rs__B1__0__4S2 p5l__rs__B1__0__4h0.bla
      mode=max dir=forward 2 multi__cycle__path p6__rs__B1__0__4S2 p5l__rs__B1__0__4h0.bla
      mode=min dir=backward 2
```

For functional simulation, we get the following asserts:

```
   // Generated with regard to the bit1 fblat
      #pragma assert AG((p6l__ps__wr__en__1h1 == 1) -> !(p6__rs__ps__sel__3h3 == PS__P6))    \
       "failed setup time assertion for gate p5l__rs__B1__0__4h2, path: p6__rs__B1__2S2 ->
p6__rs__B1__0__4S2 -> p5l__rs__B1__0__4h2"
      #pragma assert AG((p6__rs__ps__sel__3h3 == PS__P6) -> AX(!(p6l__ps__wr__en__1h1 == 1)))
\
       "failed hold time assertion for gate p5l__rs__B1__0__4h2, path: p6__rs__B1__2S2 ->
p6__rs__B1__0__4S2 -> p5l__rs__B1__0__4h2"
   // Generated with regard to the bit0 fblat
#pragma assert AG((p6l__ps__wr__en__1h1 == 1) -> !(p6__rs__ps__sel__3h3 == PS__P6))         \
       "failed setup time assertion for gate p5l__rs__B1__0__4h2, path: p6__rs__B1__2S2 ->
p6__rs__B1__0__4S2 -> p5l__rs__B1__0__4h2"
      #pragma assert AG((p6__rs__ps__sel__3h3 == PS__P6) -> AX(!(p6l__ps__wr__en__1h1 == 1)))
\
       "failed hold time assertion for gate p5l__rs__B1__0__4h2, path: p6__rs__B0__2S2 ->
p6__rs__B1__0__4S2 -> p5l__rs__B1__0__4h2"
```

Note that while the general form of the assertions remained the same, the tools recognized that for the hold-time assertion, there was a cycle boundary (hence the AX( )). Also note that the cone of logic was traced in order to generate asserts for all input signals.

It is also important to realize that while we are showing a case where a designer creates the multi-cycle timing assertion, it is possible for this to be automatically generated based on knowledge of the behavior of the static circuit (e.g. propagation time), and the topology of the receiving gate. Finally, those skilled in the art will recognize that, while the examples described above use the hardware development language and tools disclosed in U.S. Pat. Nos. 6,367,065 and 6,289,497 to instantiate NDL gates interfacing with static storage elements for illustration and analysis, the static storage elements of the present invention and the dynamic gates with which they interface can be instantiated using other gate instantiation approaches, and the same timing analysis and functional verification techniques can be applied using the tools described above or other timing and verification tools.

In sum, the present invention is a storage element apparatus capable of statically storing a dynamic input signal, and providing that signal to dynamic logic gates. The static storage device receives at least two input logic signals wherein at least one is a dynamic signal from a dynamic logic gate. The static storage device, which may or may not receive a clock signal, generates one or more static logic output signals. The static storage device includes a storage circuit comprising not more than eighteen transistors that holds at least one of the device's outputs at the signal value of at least one of the device's dynamic inputs until that input switches value on a subsequent evaluate cycle and at least one other input logic signal, which may be a write enable signal, changes signal value. The dynamic input signal may comprise one wire of a 1-of-N signal from a NDL cell. In an alternative embodiment, he storage device may not change output values until a reset signal is received during a prior clock cycle.

Other embodiments of the invention will be apparent to those skilled in the art after considering this specification or practicing the disclosed invention. The specification and examples above are exemplary only, with the true scope of the invention being indicated by the following claims.

We claim the following invention:

1. A storage element apparatus comprising:
at least two input logic signals, each having a signal value, wherein one of said input logic signals further comprises a first dynamic logic input signal with a first signal value that comprises the output of a dynamic logic cell during a first evaluate cycle, wherein said first dynamic logic input signal further comprises one wire of a 1-of-N signal and said dynamic logic cell further comprises a NDL cell;
one or more static logic output signals; and
a storage circuit comprising not more than eighteen transistors, said storage circuit receives said first and second input logic signals and holds at least one of said static logic output signals at said first signal value until both of the following events occur: said first dynamic logic input signal changes to a second signal value on a subsequent evaluate cycle, and at least one other input logic signal changes signal value.

2. A storage element system comprising:
at least two input logic signals, each having a signal value, wherein one of said input logic signals further comprises a first dynamic logic input signal with a first signal value that comprises the output of a dynamic logic cell during a first evaluate cycle, wherein said first dynamic logic input signal further comprises one wire of a 1-of-N signal and said dynamic logic cell further comprises a NDL cell;
one or more static logic output signals; and
a storage circuit comprising not more than eighteen transistors, said storage circuit receives said input logic signals and holds at least one of said static logic output signals at said first signal value until both of the following events occur: said first dynamic logic input signal changes to a second signal value on a subsequent evaluate cycle, and at least one other input logic signal changes signal value.

3. A method that makes a storage element apparatus, comprising:
providing at least two input logic signals, each having a signal value, wherein one of said input logic signals further comprises a first dynamic logic input signal with a first signal value that comprises the output of a dynamic logic cell during a first evaluate cycle, wherein said first dynamic logic input signal further comprises one wire of a 1-of-N signal and said dynamic logic cell further comprises a NDL cell; and
providing a storage circuit comprising not more than eighteen transistors, said storage circuit receives said input logic signals and generates one or more static logic output signals, at least one of said static logic output signals is held at said first signal value until both of the following events occur: said first dynamic logic input signal changes to a second signal value on a subsequent evaluate cycle, and at least one other input logic signal changes signal value.

4. A method that uses a storage element, comprising:
receiving at least two input logic signals, each having a signal value, wherein one of said input logic signals further comprises a first dynamic logic input signal with a first signal value that comprises the output of a dynamic logic cell during a first evaluate cycle, wherein said first dynamic logic input signal further comprises one wire of a 1-of-N signal and said dynamic logic cell further comprises a NDL cell; and
generating one or more static logic output signals using a storage circuit comprising not more than eighteen transistors, said storage circuit receives said input logic signals, wherein at least one of said static logic output signals is held at said first signal value until both of the following events occur: said first dynamic logic input signal changes to a second signal value on a subsequent evaluate cycle, and at least one other input logic signal changes signal value.

5. A dependent claim according to claim 1, 2, 3, or 4 wherein said storage circuit functions without a clock input.

6. A dependent claim according to claim 1, 2, 3, or 4 wherein one of said input logic signals further comprises a write enable signal.

7. A dependent claim according to claim 1, 2, 3, or 4 wherein one of said input logic signals further comprises a reset signal.

8. A storage element apparatus comprising:
at least two input logic signals, each having a signal value, wherein one of said input logic signals further comprises a first dynamic logic input signal with a first signal value, said first dynamic logic input signal comprises the output of a dynamic logic cell during a first evaluate cycle;
one or more static logic output signals; and
a storage circuit comprising not more than eighteen transistors, said storage circuit receives said input logic signals and holds at least one of said static logic output signals at said first signal value until both of the following events occur: said first dynamic logic input signal changes to a second signal value on a subsequent evaluate cycle, and at least one other input logic signal changes signal value,
wherein one of the following:
said first dynamic logic input signal further comprises one wire of a 1-of-N signal, said dynamic logic cell further comprises a NDL cell, and one of said input logic signals further comprises a write enable signal; or
said first dynamic logic input signal further comprises one wire of a 1-of-N signal, said dynamic logic cell further comprises a NDL cell, and said storage circuit functions without a clock input; or
said storage circuit functions without a clock input and one of said input logic signals further comprises a reset signal.

9. A storage element system comprising:
at least two input logic signals, each having a signal value, wherein one of said input logic signals further comprises a first dynamic logic input signal with a first signal value, said first dynamic logic input signal comprises the output of a dynamic logic cell during a first evaluate cycle;
one or more static logic output signals; and
a storage circuit comprising not more than eighteen transistors, said storage circuit receives said input logic signals and holds at least one of said static logic output signals at said first signal value until both of the following events occur: said first dynamic logic input signal changes to a second signal value on a subsequent evaluate cycle, and at least one other input logic signal changes signal value, where in one of the following:

said first dynamic logic input signal further comprises one wire of a 1-of-N signal, said dynamic logic cell further comprises a NDL cell, and one of said input logic signals further comprises a write enable signal; or said first dynamic logic input signal further comprises one wire of a 1-of-N signal, said dynamic logic cell further comprises a NDL cell, and said storage circuit functions without a clock input; or said storage circuit functions without a clock input and one of said input logic signals further comprises a reset signal.

10. A method that makes a storage element apparatus comprising:

providing at least two input logic signals, each having a signal value, wherein one of said input logic signals further comprises a first dynamic logic input signal with a first signal value, said first dynamic logic input signal comprises the output of a dynamic logic cell during a first evaluate cycle; and providing a storage circuit comprising not more than eighteen transistors that generates one or more static logic output signals, said storage circuit receives said input logic signals and holds at least one of said static logic output signals at said first signal value until both or the following events occur: said first dynamic logic input signal changes to a second signal value on a subsequent evaluate cycle, and at least one other input logic signal changes signal value, wherein one of the following:

said first dynamic logic input signal further comprises one wire of a 1-of-N signal, said dynamic logic cell further comprises a NDL cell, and one of said input logic signals further comprises a write enable signal; or said first dynamic logic input signal further comprises one wire of a 1-of-N signal, said dynamic logic cell further comprises a NDL cell, and said storage circuit functions without a clock input; or said storage circuit functions without a clock input and one of said input logic signals further comprises a reset signal.

11. A method that uses a storage element apparatus comprising:

receiving at least two input logic signals, each having a signal value, wherein one of said input logic signals further comprises a first dynamic logic input signal with a first signal value, said first dynamic logic input signal comprises the output of a dynamic logic cell during a first evaluate cycle; and generating one or more static logic output signals using a storage circuit comprising not more than eighteen transistors, said storage circuit receives said input logic signals and holds at least one of said static logic output signals at said first signal value until both of the following events occur: said first dynamic logic input signal changes to a second signal value on a subsequent evaluate cycle, and at least one other input logic signal changes signal value;

wherein one of the following:

said first dynamic logic input signal further comprises one wire of a 1-of-N signal, said dynamic logic cell further comprises a NDL cell, and one of said input logic signals further comprises a write enable signal; or said first dynamic logic input signal further comprises one wire of a 1-of-N signal, said dynamic logic cell further comprises a NDL cell, and said storage circuit functions without a clock input; or said storage circuit functions without a clock input and one of said input logic signals further comprises a reset signal.

12. A storage element apparatus comprising:

at least two input logic signals, each having a signal value, wherein one of said input logic signals further comprises a first dynamic logic input signal with a first signal value that comprises the output of a dynamic logic cell during a first evaluate cycle, wherein one of said input logic signals further comprises a reset signal;

one or more static logic output signals; and a storage circuit comprising not more than eighteen transistors, said storage circuit receives said first and second input logic signals and holds at least one of said static logic output signals at said first signal value until both of the following events occur: said first dynamic logic input signal changes to a second signal value on a subsequent evaluate cycle, and at least one other input logic signal changes signal value.

13. A storage element system comprising:

at least two input logic signals, each having a signal value, wherein one of said input logic signals further comprises a first dynamic logic input signal with a first signal value that comprises the output of a dynamic logic cell during a first evaluate cycle, wherein one of said input logic signals further comprises a reset signal;

one or more static logic output signals; and a storage circuit comprising not more than eighteen transistors, said storage circuit receives said input logic signals and holds at least one of said static logic output signals at said first signal value until both of the following events occur: said first dynamic logic input signal changes to a second signal value on a subsequent evaluate cycle, and at least one other input logic signal changes signal value.

14. A method that makes a storage element apparatus, comprising:

providing at least two input logic signals, each having a signal value, wherein one of said input logic signals further comprises a first dynamic logic input signal with a first signal value that comprises the output of a dynamic logic cell during a first evaluate cycle, wherein one of said input logic signals further comprises a reset signal; and providing a storage circuit comprising not more than eighteen transistors, said storage circuit receives said input logic signals and generates one or more static logic output signals, at least one of said static logic output signals is held at said first signal value until both of the following events occur: said first dynamic logic input signal changes to a second signal value on a subsequent evaluate cycle, and at least one other input logic signal changes signal value.

15. A method that uses a storage element, comprising:

receiving at least two input logic signals, each having a signal value, wherein one of said input logic signals further comprises a first dynamic logic input signal with a first signal value that comprises the output of a dynamic logic cell during a first evaluate cycle wherein one of said input logic signals further comprises a reset signal; and generating one or more static logic output signals using a storage circuit comprising not more than eighteen transistors, said storage circuit receives said input logic signals, wherein at least one of said static logic output signals is held at said first signal value until both of the following events occur: said first dynamic logic input signal changes to a second signal value on a subsequent evaluate cycle, and at least one other input logic signal changes signal value.

16. A dependent claim according to claim 12, 13, 14, or 15 wherein said first dynamic logic input signal further comprises one wire of a 1-of-N signal and said dynamic logic cell further comprises a NDL cell.

17. A dependent claim according to claim 12, 13, 14, or 15 wherein said storage circuit functions without a clock input.

18. A dependent claim according to claim 12, 13, 14, or 15 wherein one of said input logic signals further comprises a write enable signal.

* * * * *

UNITED STATES PATENT AND TRADEMARK OFFICE
CERTIFICATE OF CORRECTION

| | | |
|---|---|---|
| PATENT NO. | : 6,956,406 B2 | Page 1 of 1 |
| APPLICATION NO. | : 10/187879 | |
| DATED | : October 18, 2005 | |
| INVENTOR(S) | : Michael R. Seningen et al. | |

It is certified that error appears in the above-identified patent and that said Letters Patent is hereby corrected as shown below:

On the Title Pg, Item (74) in "Attorney, Agent, or Firm", line 1, delete "Mathew" and insert -- Matthew --, therefor.

In column 2, line 36, delete "6,259,497" and insert -- 6,289,497 --, therefor.

In column 9, line 20, delete "practioners'" and insert -- practitioners' --, therefor.

In column 9, lines 25-26, delete "nonessential" and insert -- non-essential --, therefor.

In column 13, line 3, delete "he" and insert -- the --, therefor.

In column 15, line 6, in Claim 9, delete "where in" and insert -- wherein --, therefor.

In column 15, line 31, in Claim 10, delete "or" and insert -- of --, therefor.

In column 16, line 65, in Claim 15, delete "cycle" and insert -- cycle, --, therefor.

Signed and Sealed this
Fifteenth Day of November, 2011

David J. Kappos
*Director of the United States Patent and Trademark Office*